United States Patent
Sano

(10) Patent No.: US 6,424,572 B2
(45) Date of Patent: Jul. 23, 2002

(54) SEMICONDUCTOR MEMORY APPARATUS THAT CAN SURELY ATTAIN DISCHARGE OPERATION WHILE REDUCING DISCHARGE PERIOD WHEN READING OPERATION IS DONE

(75) Inventor: Yuuichi Sano, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/817,049

(22) Filed: Mar. 27, 2001

(30) Foreign Application Priority Data

Mar. 31, 2000 (JP) ........................................ 2000-099067

(51) Int. Cl.[7] .............................................. G11C 16/06
(52) U.S. Cl. .............................. 365/185.25; 365/185.18
(58) Field of Search ...................... 365/185.18, 185.21, 365/185.25, 189.09

(56) References Cited

U.S. PATENT DOCUMENTS 5,402,382 A * 3/1995 Miyawaki et al. .......... 365/218
5,440,509 A * 8/1995 Momodomi et al. ... 365/185.13
5,448,518 A * 9/1995 Jinbo ..................... 365/230.01

FOREIGN PATENT DOCUMENTS

| JP | 10-64289 | 3/1998 |
| JP | 11-17519 | 1/1999 |

* cited by examiner

Primary Examiner—Son Mai
(74) Attorney, Agent, or Firm—Sughrue Mion, PLLC

(57) ABSTRACT

A semiconductor memory apparatus includes a plurality of memory cells (MC1~MC4); and a write circuit (44). The write circuit (44) performs a writing operation on the memory cell (MC1). A first voltage is supplied to the write circuit (44) when the writing operation is performed on the memory cell (MC1). A second voltage equal to or lower than the first voltage is supplied to the write circuit (44) when a reading operation is performed on the memory cell (MC1).

20 Claims, 8 Drawing Sheets

SEMICONDUCTOR MEMORY APPARATUS THAT CAN SURELY ATTAIN DISCHARGE OPERATION WHILE REDUCING DISCHARGE PERIOD WHEN READING OPERATION IS DONE

BACKGROUND OF THE INVENTION

1. Field of the Invention

The present invention relates to a semiconductor memory apparatus. More particularly, the present invention relates to a non-volatile memory.

2. Description of the Related Art

In recent years, a non-volatile memory constituted by non-volatile memory cells having floating gates has been vigorously developed. As shown in FIG. 1, a conventional non-volatile memory is provided with a word line W1, a word line W2, an X-decoder 41, a bit line B1, a bit line B2, output signals Y1, Y2, a sense amplifier 43, an N-channel transistor N1, an N-channel transistor N2, an N-channel transistor N3, an N-channel transistor N4, a P-channel transistor P1 and a P-channel transistor P2.

The word line W1 is connected to the control gates of memory cells MC1, MC2. The word line W2 is connected to the control gates of memory cells MC3, MC4. The X-decoder 41 is connected to the word lines W1, W2. The bit line B1 is connected to drains of the memory cells MC1, MC3. The bit line B2 is connected to drains of the memory cells MC2, MC4. The output signals Y1, Y2 are connected to a Y-decoder 42. The sense amplifier 43 receives a pre-charge signal PRECH. The N-channel transistor N1 is connected to the bit line B1 and the sense amplifier 43, and receives from a gate thereof the output signal Y1. The N-channel transistor N2 is connected to the bit line B2 and the sense amplifier 43, and receives from a gate thereof the output signal Y2. The N-channel transistor N3 is connected to the bit line B1 and a GND power supply, and receives from a gate thereof a discharge signal DIS. The N-channel transistor N4 is connected to the bit line B2 and the GND power supply, and receives from a gate thereof the discharge signal DIS. The P-channel transistor P1 is connected to the bit line B1 and a VDD power supply, and receives from a gate thereof an input signal DW1. And, the P-channel transistor P2 is connected to the bit line B2 and the VDD power supply, and receives from a gate thereof an input signal DW2.

Each of the memory cells MC1 to MC4 is a non-volatile memory cell having the control gate and the floating gate. A threshold of the memory cell is controlled on the basis of an amount of electrons sent to the floating gate.

For example, when the electrons are implanted into the floating gate, its threshold VTM becomes high. For example, it is set to 6 V. Also, if the electrons are drawn out from the floating gate, its threshold VTM becomes low. For example, it is set to 2 V.

Here, if the threshold VTM of the memory cell is high (for example, VTM=6 V) so that the memory cell is sufficiently turned off even when a voltage to read a data stored in the memory cell, for example, 4 V is applied to the word line, it is assumed that a data "0" is stored in its memory cell. If the VTM is low (for example, VTM=2 V) so that the memory cell is sufficiently turned on, it is assumed that a data "1" is stored in the memory cell.

A write circuit 44 has the P-channel transistors P1, P2. It sets the input signal DW1 or DW2 at a low level at a time of a writing operation, and supplies the VDD power supply through the transistor P1 or P2 to the bit line B1 or B2.

The sense amplifier 43 receives the pre-charge signal PRECH. When its signal becomes at a high level, it supplies 1 V as a pre-charge level to the N-channel transistors N1, N2.

The operation for reading the data stored in the memory cell in this conventional example will be described below with reference to timing charts of FIGS. 2A to 2I.

By the way, let us suppose that the data "0" is stored in the memory cells MC1, MC2, and the data "1" is stored in the memory cells MC3, MC4. It is assumed to read the data in the memory cell MC1.

At first, the bit lines B1, B2 are discharged (a period ti). So, the output signals Y1, Y2 of the Y-decoder 42 are set to the low level, and the discharge signal DIS is set to the high level. The input signals DW1, DW2 are set to the high level. Thus, the N-channel transistors N1, N2 are turned off. The N-channel transistors N3, N4 are turned on. The P-channel transistors P1, P2 are turned off. And, the bit lines B1, B2 are set to the GND level.

Next, a selected bit line (here, the bit line B1) is pre-charged (a period t2). So, the output signal Y1 is set to the high level, and the output signal Y2 is set to the low level. The pre-charge signal PRECH is set to the high level, and the discharge signal DIS is set to the low level. Thus, the N-channel transistors N2 to N4 are turned off, and the N-channel transistor N1 is turned on. Hence, 1 V implying the pre-charge level is supplied to the bit line B1 through the transistor N1 from the sense amplifier.

Next, a voltage to carry out the reading operation is supplied to a word line (here, the word line W1) of the memory cell to be selected, and a sampling is carried out (a period t3). To do so, the pre-charge signal PRECH is set to the low level. The word lines W1, W2 are switched to the high level (for example, 4 V), and the low level (for example, 0 V), respectively. Thus, 1 V is supplied to the drain of the memory cell MC1, and 4 V is supplied to the control gate. Then, the stored data is sampled. Since the data "0" is stored in the memory cell MC1, a current does not flow through the memory cell MC1. Hence, a potential of the bit line is not changed, and it is kept at 1 V. Its level as the data "0" is detected by the sense amplifier 43. By the way, if the data "1" is stored in the memory cell, the current flows through the memory cell. Hence, the potential of the bit line is changed from 1 V to 0.9 V. Its changed level as the data "1" is detected by the sense amplifier 43. The operation for reading the memory cell MC1 is ended after the above-mentioned operations.

In the reading operation, the potential of the bit line is once set to the GND level by the discharge operation. After that, it is pre-charged to 1 V. Thus, when the data "1" is sampled, the time required to change the potential of the bit line from 1 V to 0.9 V is reduced to thereby enable the reading operation to be made faster.

However, even in the discharge operation, as the potential of the bit line is higher, it is necessary to make the discharge period longer. Although 4 V is applied to the word line W1 at the time of the sampling of the memory cell MC1, the data "0" is stored in the memory cell MC2. So, the memory cell MC2 is at the off-state. For this reason, if a leakage current exists in the P-channel transistor P2 in the write circuit 44, the bit line B2 is charged by the leakage current during the sampling of the memory cell MC1. Thus, there may be a possibility that the potential of the bit line B2 is raised up to a maximum VDD level. Also, since the data stored in the memory cell MC1 is at "0", the memory cell MC1 is at the off-state. Hence, even the bit line B1 is similarly charged by the leakage current, and there may be a possibility that it is raised up to the maximum VDD level.

In order to read the memory cell MC2 after reading the memory cell MC1, the bit line is discharged (a period t4). However, there may be a possibility that the potential of the bit line B2 is equal to or greater than 1 V implying an expectation value (an over-discharge state). Thus, in order to surely discharge the bit line, it is necessary to make the discharge period longer. Hence, the conventional non-volatile memory has the problem of the impediment against the higher speed of the reading operation.

Japanese Laid Open Patent Application (JP-A-Heisei, 10-64289) discloses the following non-volatile memory. In the non-volatile memory containing: a memory cell array in which memory cells arrayed in a form of rows and columns are mounted; and a row decoder having voltage supply transistor circuits for supplying voltages to the control gates of the memory cells when data are written to the memory cells, in which the number of voltage supply transistor circuits corresponds to the number of rows, each of the voltage supply transistor circuits is divided into a plurality of blocks, and the voltage supply ability of the voltage supply transistor circuit in each block can be controlled on the basis of an address given to the row decoder.

Japanese Laid Open Patent Application (JP-A-Heisei, 11-17519) discloses the following output buffer circuit. It is provided with: an output drive buffer driven by an input signal; a transistor connected between an output terminal and an output end of the output drive buffer; a switch for connecting a gate electrode of the transistor to a power supply potential or releasing it therefrom; a control circuit for generating a predetermined control signal from the input signal and outputting from the output end; and a capacitance element connected between the gate electrode and the output end of the control circuit. The control circuit, when the input signal is changed, once turns off the switch, and turns on it after a predetermined period, and charges the capacitance element when it is at the off-state, and inverts a potential of the output end in response to the transition from the off-state to the on-state.

SUMMARY OF THE INVENTION

The present invention is accomplished in view of the above mentioned problems. Therefore, an object of the present invention is to provide a semiconductor memory apparatus that can surely attain a discharge operation while reducing a discharge period when a reading operation is done.

Another object of the present invention is to provide a semiconductor memory apparatus that can make a reading operation faster.

In order to achieve an aspect of the present invention, a semiconductor memory apparatus, includes: a plurality of memory cells; and a write circuit performing a writing operation on the memory cell, and wherein a first voltage is supplied to the write circuit when the writing operation is performed on the memory cell, and wherein a second voltage equal to or lower than the first voltage is supplied to the write circuit when a reading operation is performed on the memory cell.

In this case, a semiconductor memory apparatus, includes: a plurality of memory cells connected to a plurality of bit lines; and a write circuit performing a writing operation on the memory cell, and wherein a specific voltage is supplied to the write circuit when a reading operation is performed on the memory cell, the specific voltage being equal to or lower than a voltage of the bit line selected when the reading operation is performed.

In order to achieve another aspect of the present invention, a semiconductor memory apparatus, includes: a plurality of memory cells; a plurality of bit lines connected to the. plurality of memory cells; a write circuit connected to the plurality of bit lines; and an N-channel transistor for connecting a first power supply to the write circuit when a first operation is performed and for connecting a second power supply different from the first power supply to the write circuit when a second operation different from the first operation is performed.

In this case, a first electrode of the N-channel transistor is connected to the write circuit, and a second electrode of the N-channel transistor is connected to a specific power supply, and one of a first voltage corresponding to the first power supply and a second voltage corresponding to the second power supply is supplied to a control electrode of the N-channel transistor.

Also in this case, the N-channel transistor is an N-channel non-doped transistor.

Further in this case, the semiconductor memory apparatus, further includes: a first transistor connected to the first power supply and to the control electrode of the N-channel transistor; and a second transistor connected to the second power supply and to the control electrode of the N-channel transistor.

In this case, the first and second transistors are a same conductive type with each other, and wherein a read signal outputted when a reading operation is performed on the memory cell is supplied to a control electrode of the first transistor, and wherein a reverse signal of the read signal is supplied to a control electrode of the second transistor.

Also in this case, a conductive type of the first transistor is opposite to a conductive type of the second transistor, and wherein a read signal outputted when a reading operation is performed on the memory cell is supplied to control electrodes of the first and second transistors.

Further in this case, the write circuit includes a P channel transistor provided between the N-channel transistor and the bit line.

In this case, the semiconductor memory apparatus, further includes: a first resistor connected between the first power supply and the second transistor; and a second resistor connected between a ground and the second transistor.

Also in this case, the memory cell is a non-volatile memory cell having a floating gate.

Further in this case, a second specific voltage corresponding to the second power supply is equal to or lower than a first specific voltage corresponding to the first power supply.

In this case, the second operation is a reading operation performed on the memory cell, and the first operation is any one of operations other than the reading operation.

Also in this case, the first operation is a writing operation performed on the memory cell.

Further in this case, the first specific voltage is a voltage of the bit line selected when a reading operation is performed on the memory cell.

In this case, the specific voltage is supplied to the write circuit such that the bit line is not charged beyond the specific voltage even if the bit line is charged by a leakage current outputted from the write circuit.

Also in this case, the second power supply includes a third transistor of a conductive type opposite to the conductive type of the first and second transistors connected to the second transistor, and a first unit supplying a third power supply voltage to the third transistor in response to the read signal, and a second unit supplying a voltage higher by a threshold voltage of the third transistor than the second power supply in voltage to a control electrode of the third transistor in response to the read signal.

Further in this case, the second power supply includes a same conductive type of third transistor with the second transistor connected to the second transistor, and a first unit supplying a third power supply voltage to the third transistor in response to the read signal, and a second unit supplying a voltage higher by a threshold voltage of the third transistor than the second power supply in voltage to a control electrode of the third transistor in response to the read signal.

In this case, the semiconductor memory apparatus, further includes: a sense amplifier connected to the plurality of bit lines supplying a read voltage to the plurality of bit lines in case of a first mode and detecting a change of a voltage of the bit line based on whether the memory cell is in a conducting state or a not-conducting state in case of a second mode.

Also in this case, the sense amplifier includes a current mirror circuit sensing a voltage level of the bit line, a third unit outputting the read voltage to the bit line, and a fourth unit activating the current mirror circuit and deactivating the third unit when a pre-charge signal is a first level and deactivating the current mirror circuit and activating the third unit when the pre-charge signal is a second level different from the first level.

DESCRIPTION OF THE PREFERRED EMBODIMENTS

An embodiment of a facsimile apparatus of the present invention will be described below with reference to the attached drawings.

A semiconductor memory apparatus in the present invention has the following feature. That is, at a time of a reading operation, a power supply of a write circuit 44 connected to a bit. line is set to be equal to or less than a potential of the bit line at the time of the reading operation. Accordingly, the bit line can be prevented from being excessively charged because of a leakage current from the write circuit 44. Thus, a discharge period of the bit line can be reduced to a minimum.

Figure 3:
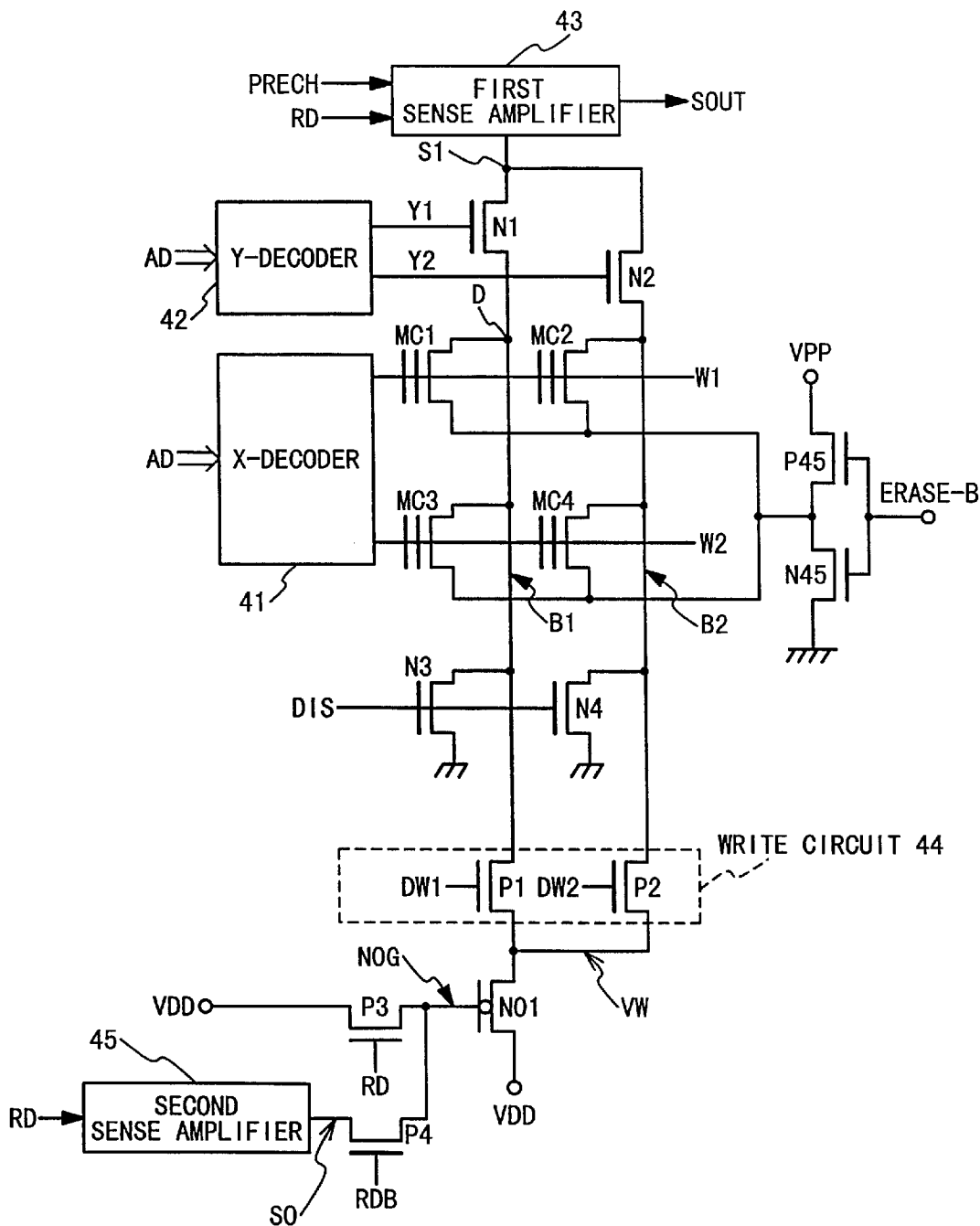
FIG. 3 is a circuit diagram showing a first embodiment of the present invention.
Figure 4:
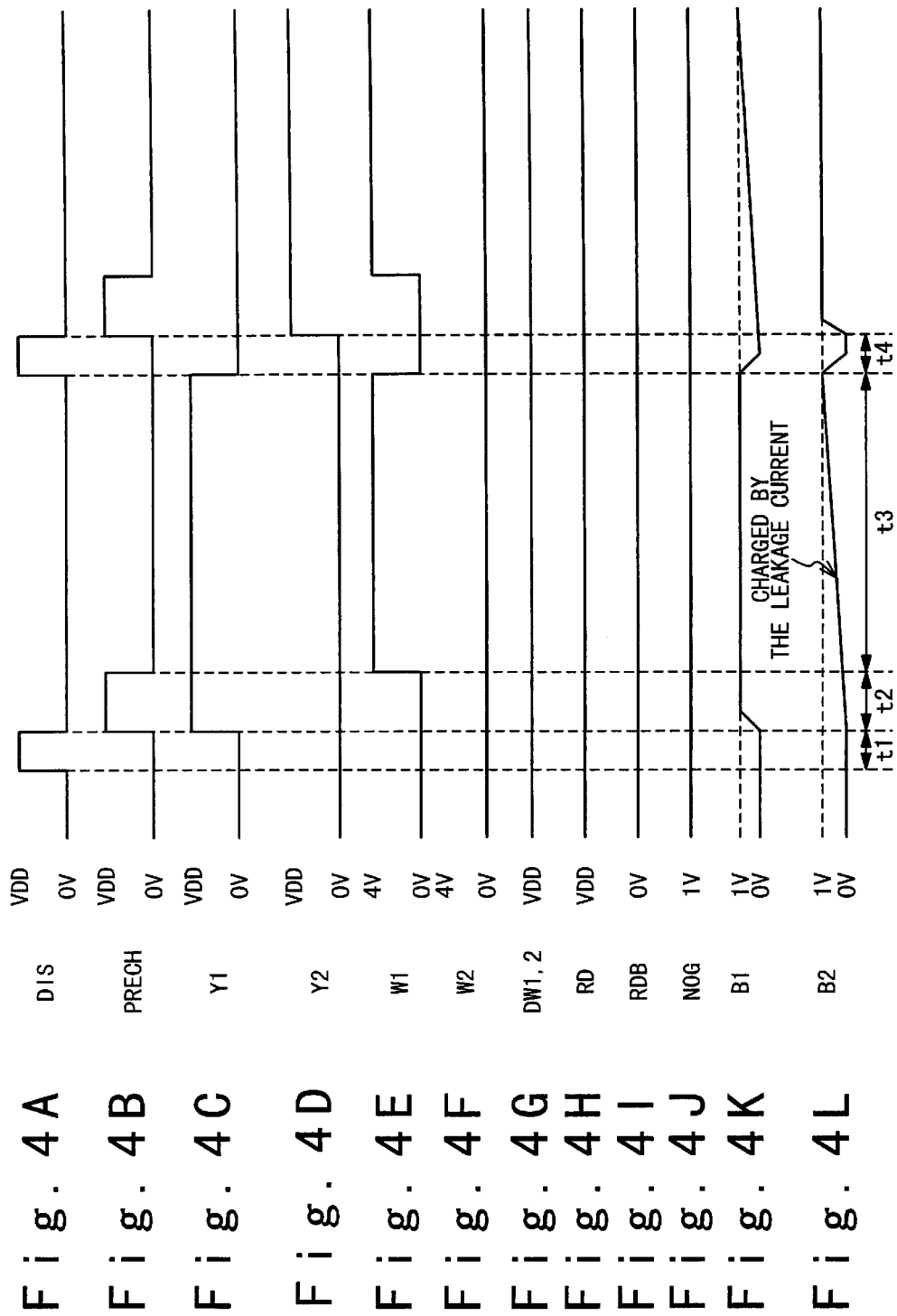
FIG. 4A is a timing chart showing a potential of a discharge signal DIS, in a reading operation of the semiconductor memory apparatus shown in FIG. 3.
FIG. 4B is a timing chart showing a potential of a pre-charge signal PRECH, in the reading operation of the semiconductor memory apparatus shown in FIG. 3.
FIG. 4C is a timing chart showing a potential of an output signal Y1, in the reading operation of the semiconductor memory apparatus shown in FIG. 3.
FIG. 4D is a timing chart showing a potential of an output signal Y2, in the reading operation of the semiconductor memory apparatus shown in FIG. 3.
FIG. 4E is a timing chart showing a potential of a word line W1, in the reading operation of the semiconductor memory apparatus shown in FIG. 3.
FIG. 4F is a timing chart showing a potential of a word line W2, in the reading operation of the semiconductor memory apparatus shown in FIG. 3.
FIG. 4G is a timing chart showing potentials of input signals DW1, DW2, in the reading operation of the semiconductor memory apparatus shown in FIG. 3.
FIG. 4H is a timing chart showing a potential of an read signal RD, in the reading operation of the semiconductor memory apparatus shown in FIG. 3.
FIG. 4I is a timing chart showing a potential of an inversion read signal RDB in the reading operation of the semiconductor memory apparatus shown in FIG. 3.
FIG. 4J is a timing chart showing a potential of gate electrode of an N-channel non-doped transistor in the reading operation of the semiconductor memory apparatus shown in FIG. 3.
FIG. 4K is a timing chart showing a potential of a bit line B1, in the reading operation of the semiconductor memory apparatus shown in FIG. 3.
FIG. 4L is a timing chart showing a potential of a bit line B2, in the reading operation of the semiconductor memory apparatus shown in FIG. 3.

In FIG. 3, an N-channel non-doped transistor N01 is mounted between P-channel transistors P1, P2 and a terminal to supply a power supply potential VDD (for example, 5 V), and a P-channel transistor P4 for receiving from a gate thereof an input signal RDB is mounted between a second sense amplifier 45 and a contact N0G serving as a gate input of the N-channel non-doped transistor N01.

At the time of the reading operation, 1 V equal to a potential of a selected bit line B1 or B2 is outputted to an output signal SO of the second sense amplifier 45, and the input signal RDB is at the low level. Thus, 1 V is supplied to the contact N0G. Since a threshold of the N-channel non-doped transistor is 0 V, 1 V is also supplied to a power supply VW of the write circuit 44. Also, since input signals DW1, DW2 are at the high level, the P-channel transistors P1, P2 are turned off. Even if a leakage current flows through the P-channel transistor P1 or P2 to thereby charge the bit line, its potential is only raised up to 1 V equal to the potential of the selected bit line.

Thus, it is possible to prevent the bit lines B1, B2 from being excessively charged because of the leakage currents of the P-channel transistors P1, P2 in the write circuit 44. Also, when the reading operation is done, it is necessary to firstly set the bit lines B1, B2 to the GND level by using N-channel transistors N3, N4. However, since the bit line is not excessively charged, the discharge period can be reduced to a minimum.

By the way, the leak occurring in the P-channel transistor P1 or P2 is a sub-threshold leak and/or a junction leak. Today, the existence of such leak can not be removed because of the development of hyperfine structure.

Figure 1:
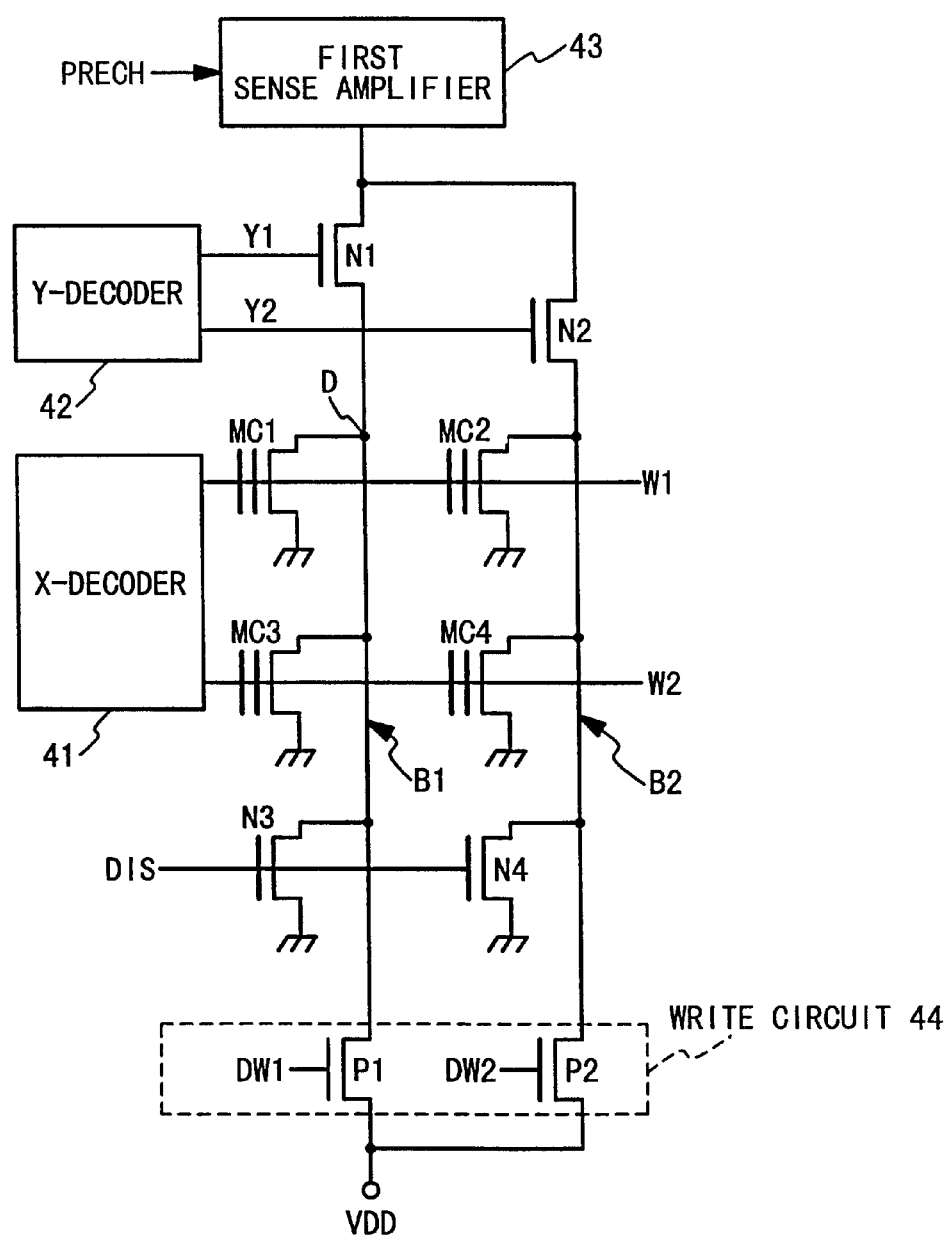
FIG. 1 is a circuit diagram showing a conventional semiconductor memory apparatus.
Figure 2:
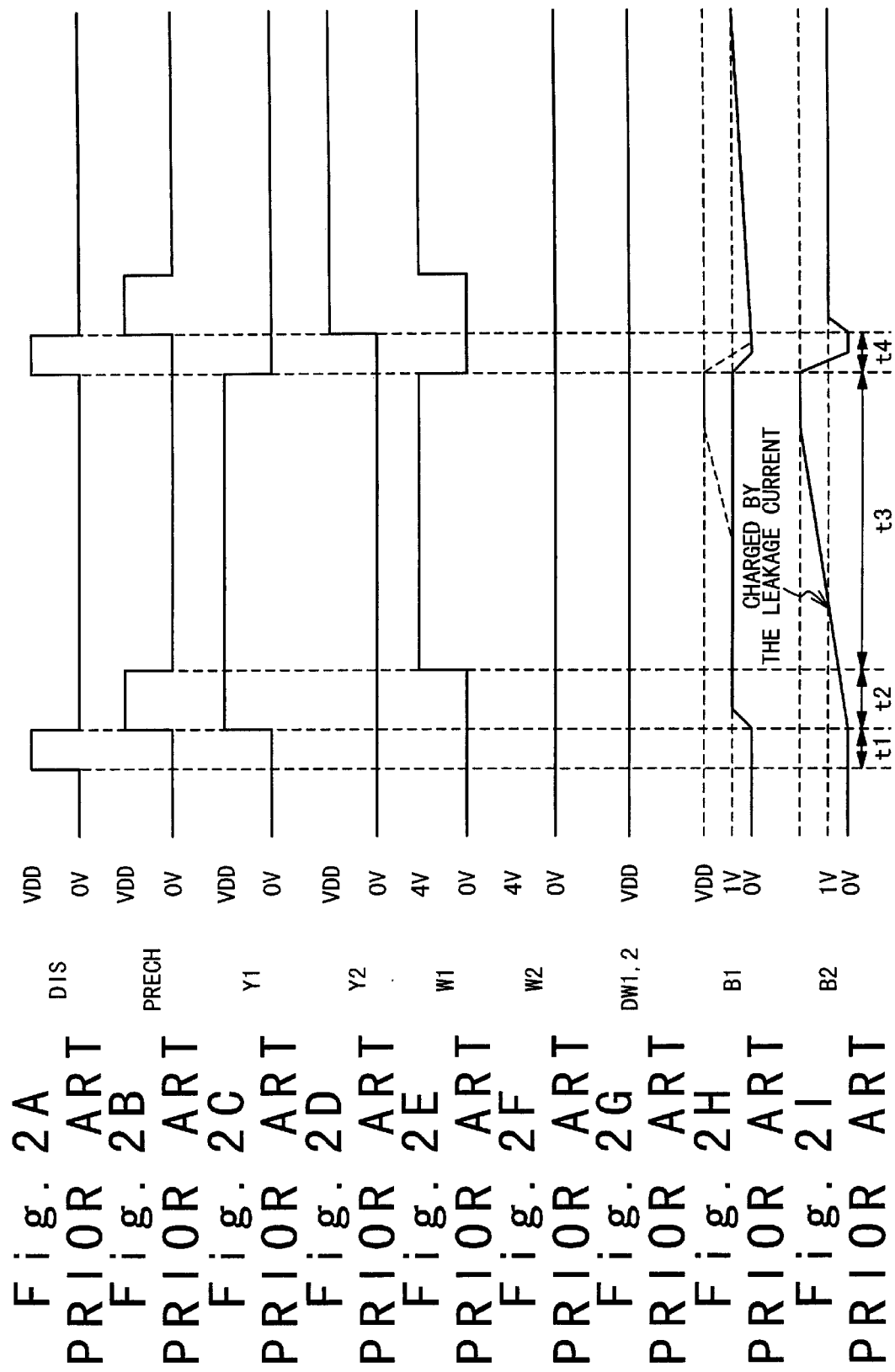
FIG. 2A is a timing chart showing a potential of a discharge signal DIS, in a reading operation of the semiconductor memory apparatus shown in FIG. 1.
FIG. 2B is a timing chart showing a potential of a pre-charge signal PRECH, in the reading operation of the semiconductor memory apparatus shown in FIG. 1.
FIG. 2C is a timing chart showing a potential of an output signal Y1, in the reading operation of the semiconductor memory apparatus shown in FIG. 1.
FIG. 2D is a timing chart showing a potential of an output signal Y2, in the reading operation of the semiconductor memory apparatus shown in FIG. 1.
FIG. 2E is a timing chart showing a potential of a word line W1, in the reading operation of the semiconductor memory apparatus shown in FIG. 1.
FIG. 2F is a timing chart showing a potential of a word line W2, in the reading operation of the semiconductor memory apparatus shown in FIG. 1.
FIG. 2G is a timing chart showing potentials of input signals DW1, DW2, in the reading operation of the semiconductor memory apparatus shown in FIG. 1.
FIG. 2H is a timing chart showing a potential of a bit line B1, in the reading operation of the semiconductor memory apparatus shown in FIG. 1.
FIG. 2I is a timing chart showing a potential of a bit line B2, in the reading operation of the semiconductor memory apparatus shown in FIG. 1.

Also, it is possible to substantially ignore the off-leak of the N-channel non-doped transistor N01. This is because the off-leak of the N-channel transistor is several times smaller than the off-leak of the P-channel transistor. When 1 V is supplied to the gate N0G of the transistor N01, a level of a line VW is 1 V. When the leak occurs in the transistor N01 at that time, a voltage between the gate and the source of the transistor N01 is increased in a negative direction (namely, although the voltage of the gate N0G is 1 V, the voltage of the line VW is 1 V or more). So, the leakage current of the transistor N01 is extremely dropped. On the other hand, in the conventional semiconductor apparatus shown in FIG. 1, the transistor P2 is the P-channel transistor. Even if the leak occurs in its transistor, the voltage between the gate and the source is not changed (namely, a high level (for example, 5 V) is supplied to the gate, and VDD (for example, 5 V) is supplied to the source). Thus, the leak amounts of the transistors P1, P2 themselves are not changed. Hence, the leakage currents of the conventional transistors P1, P2 are incommensurably larger than the leakage current in the apparatus of the present invention.

FIG. 3 shows a first embodiment of a semiconductor memory apparatus in the present invention.

A semiconductor memory apparatus in this embodiment has memory cell arrays each provided with a plurality of memory cells arranged in a form of matrix. FIG. 3 shows non-volatile memory cells MC1 to MC4 that are a part of the memory cell arrays. A word line W1 is connected to the control gates of the memory cells MC1, MC2. A word line W2 is connected to the control gates of the memory cells MC3, MC4. An X-decoder 41 for receiving an address AD is connected to the word lines W1, W2. A bit line B1 is connected to drains of the memory cells MC1, MC3. A bit line B2 is connected to drains of the memory cells MC2, MC4. Respective sources of the memory cells MC1 to MC4 are connected to a source power supply circuit constituted by a P-channel transistor P45 and an N-channel transistor N45. An inversion erase signal ERASE_B is sent to gates of the transistors P45 and N45. A VPP power supply (for example, 10 V) is supplied to a source of the transistor P45.

A Y-decoder 42 receives the address signal AD, and drives output signals Y1, Y2 in response to the signal. A first sense amplifier 43 receives a pre-charge signal PRECH and a read signal RD. The first sense amplifier 43 drives a node S1 to 1 V when the pre-charge signal PRECH is at the high level in a condition that the read signal RD is at the high level, and senses the level of a node S1 when the pre-charge signal PRECH is at the low level, and then outputs its result as an output signal Sout. An N-channel transistor N1 is connected between the bit line B1 and the node S1, and receives from a gate thereof the output signal Y1. An N-channel transistor N2 is connected between the bit line B2 and the first sense amplifier 43, and receives from a gate thereof the output signal Y2. An N-channel transistor N3 is connected between the bit line B1 and a GND power supply, and receives from a gate thereof a discharge signal DIS. An N-channel transistor N4 is connected between the bit line B2 and the GND power supply, and receives from a gate thereof the discharge signal DIS. A P-channel transistor P1 is connected between the bit line B1 and the power supply VW of the write circuit 44, and receives from a gate thereof a write signal DW1. A P-channel transistor P2 is connected between the bit line B2 and the power supply VW, and receives from a gate thereof a write signal DW2. The transistors P1, P2 constitutes the write circuit 44. The N-channel non-doped transistor N01 is connected between the P-channel transistors P1, P2 and a VDD power supply (for example, 5 V), and receives from a gate thereof a contact N0G. It is assumed that a threshold (VTN0) of the N-channel non-doped transistor N01=0 V. A P-channel transistor P3 is connected between the VDD power supply and the contact N0G, and receives from a gate thereof the read signal RD. A P-channel transistor P4 is connected between the contact N0G and the output signal SO of the second sense amplifier 45, and receives from a gate thereof an inversion read signal RDB. The second sense amplifier 45 is the circuit which receives the read signal RD, and outputs, for example, 1 V when the read signal RD is at the high level.

At the time of the reading operation, the P-channel transistor P4 receives the read signal RD at the low level, and accordingly supplies the potential of the output signal SO of the second sense amplifier 45 to the contact N0G. At this time, the read signal RD at the high level is sent to the gate of the transistor P3. Thus, it is at the off-state.

In the operational cases such as the writing operation and the like except the reading operation, for example, at the time of the writing operation, the P-channel transistor P3 receives the read signal RD at the low level, and accordingly supplies the VDD potential to the contact N0G. At this time, by setting the write signal DW1 or DW2 to the low level, the VDD level of the power supply VD is supplied through the P-channel transistor P1 or P2 of the write circuit 44 to the bit line B1 or B2.

At a time of an erase operation, the inversion erase signal ERASE_B becomes at the low level, and the VPP potential is supplied to the sources of the memory cells MC1 to MC4. In the cases except the erase operation, the inversion erase signal ERASE_B becomes at the high level, and the GND potential (for example, 0 V) is supplied to the sources of the memory cells MC1 to MC4.

Here, if a threshold VTM of the memory cell is high (VTM=6 V) such that the memory cell is sufficiently turned off even if a voltage=4 V to read the data stored in the memory cell is applied to the word line, it is assumed that a data "0" is stored in the memory cell. If the VTM (VTM=2 V) is low such that the memory cell is sufficiently turned on, it is assumed that a data "1" is stored in the memory cell.

The operation for reading the data stored in the memory cell according to the embodiment of the present invention will be described below with reference to the timing charts in FIGS. 3, 4A–4L.

FIGS. 4A–4L are views showing the timing chart when the data stored in the memory cell MC1 is read. By the way, it is assumed that the data "0" is stored in the memory cells MC1, MC2 and that the data "1" is stored in the memory cells MC3, MC4. At this time, the second sense amplifier 45, since the read signal RD at the high level is sent, outputs 1 V equal to the potential at the selection state of the bit line B1 or B2 in the reading operation as the output signal SO. The read signal RD at the high level is also sent to the first sense amplifier 43. The GND potential is supplied to the sources of the memory cells MC1 to MC4 since the inversion erase signal ERASE_B is at the high level. Also, the read signal RD is at the high level, and the inversion read signal RDB is at the low level. Thus, the P-channel transistors P3, P4 are turned off and on, respectively. 1 V is supplied to the contact N0G. 1 V is supplied through the N-channel non-doped transistor N01 to the power supply VW of the write circuit 44. The input signals DW1, DW2 are at the high level in order to turn off the transistors P1, P2.

At first, the bit line is discharged (periods t1 of FIGS. 4A–4L). The output signals Y1, Y2 of the Y-decoder 42 are firstly set to the low level, and the discharge signal DIS is set to the high level. Thus, the N-channel transistors N1, N2 are turned off, and the N-channel transistors N3, N4 are turned on. The P-channel transistors P1, P2 are turned off. So, the bit lines B1, B2 are set to the GND level.

Next, the selected bit line is pre-charged (periods t2 of FIGS. 4A–4L). In order to read the data stored in the memory cell MC1, so as to pre-charge the bit line B1, the output signal Y1 is set to the high level, and the output signal Y2 is set to the low level, and the pre-charge signal PRECH is set to the high level, and the discharge signal DIS is set to the low level. Thus, the N-channel transistors N2 to N4 are turned off, and the N-channel transistor N1 is turned on. Hence, 1 V implying the pre-charge level is supplied to the bit line Bi from the first sense amplifier 43.

Next, a voltage to carry out the reading operation is supplied to a word line of the memory cell to be selected, and a sampling is done (periods t3 of FIGS. 4A–4L). In order to read the data stored in the memory cell MC1, the pre-charge signal PRECH is set to the low level. The word lines W1, W2 are set to 4 V and 0 V, respectively.

Thus, 1 V is supplied to the drain of the memory cell MC1, and 4 V is supplied to the control gate. Then, the stored data is sampled. Since the data "0" is stored in the memory cell MC1, a current does not flow through the memory cell MC1. So, the bit line is kept at 1 V. The first sense amplifier 43 detects the potential of the bit line B1 of 1 V, and outputs its result as an output signal Sout. By the way, if the data "1" is stored in the memory cell, the current flows through the memory cell. Hence, the potential of the bit line is changed from 1 V to 0.9 V. The first sense amplifier 43 outputs the result based on the change of the potential.

The reading operation in the memory cell MC1 is ended after the above-mentioned operations.

When the data "1" is sampled in the reading operation, if the potential of the bit line is high beyond the necessity, a time required when the potential of the bit line is changed to 0.9 V is extended. So, the potential of the bit line is once set to the GND level by the discharge operation. After that, it is pre-charged to 1 V. However, it is necessary to extend the discharge period if the potential of the bit line is high beyond the necessity, even in the discharge operation. When the memory cell MC1 is sampled, 4 V is applied to the word line W1. However, since the data "0" is stored in the memory cell MC2, the memory cell MC2 is at the off-state. If the leakage current exists in the P-channel transistor P2 of the write circuit 44 at this time, the bit line B2 is charged by the leakage current during the sampling of the memory cell MC1. However, since the power supply VW is at 1 V, the voltage of the bit line B2 is only raised up to 1 V equal to the potential of the bit line selected to carry out the reading operation. For this reason, the bit line B2 is discharged (periods t4 of FIGS. 4A–4L) in order to read the memory cell MC2 after reading the memory cell MC1. However, since the potential of the bit line B2 is 1 V implying an expectation value, the bit line can be discharged in the original discharge period.

As mentioned above, at the time of the reading operation, the power supply of the write circuit 44 connected to the bit line is set to be equal to or less than the potential of the bit line selected at the time of the reading operation. Accordingly, even if the leakage current flows from the write circuit 44, the bit line can be prevented from being excessively charged. Thus, the discharge period of the bit line can be reduced to a minimum. Hence, the reading operation can be made faster without any increase in the discharge period.

The erase operation will be described below. The transistors N1, N2, P1 and P2 are turned off by setting the output signals Y1, Y2 of the Y-decoder 42 to the low level, and setting the signals DW1, DW2 of the write circuit 44 to the high level. Since the pre-charge signal PRECH becomes at the high level and the read signal RD becomes at the low level, the N-channel transistor N10 is turned off, and the bit lines B1, B2 becomes at a floating state. The inversion erase signal ERASE_B becomes at the low level, and the VPP level is supplied to the sources of the memory cells MC1 to MC4. The GND potential is supplied to the word lines W1, W2. The above-mentioned operations enable the VPP level to be supplied to the respective sources of the memory cells MC1 to MC4. Since the drain is at the floating state, and the GND level is supplied to the gate, the erase operation is performed on each of the memory cells MC1 to MC4. For example, the thresholds VTM of the memory cells MC1 to MC4 are reset to 2 V (the data "1"). By the way, since the read signal RD is at the low level at this time, the transistor P3 is turned off, and the VDD potential is supplied to a node N0G.

The writing operation will be described below. Here, the operation for writing the data "1" to the memory cell MC1 is described as an example. Since the inversion erase signal ERASE_B becomes at the high level, the transistor N45 is turned on, and the GND potential is supplied to the sources of the memory cells MC1 to MC4. Both the output signals Y1, Y2 of the Y-decoder 42 are changed to the low level, and the discharge signal DIS is changed to the low level. Since the read signal RD becomes at the low level, the VDD level is supplied to the node N0G, and the power supply VW becomes at the VDD potential. Since the signal DW1 of the write circuit 44 becomes at the low level, and the signal DW2 becomes at the high level, the VDD level is supplied to the bit line B1. Also, the word line W1 is changed to the VPP level. Thus, the VPP level is supplied to the gate of the memory cell MC1, the GND level is supplied to the source thereof, and the VDD level is supplied to the drain thereof. Hence, the threshold VTM of the memory cell MC1 becomes 6 V, and the data "0" is written thereto.

Figure 5:
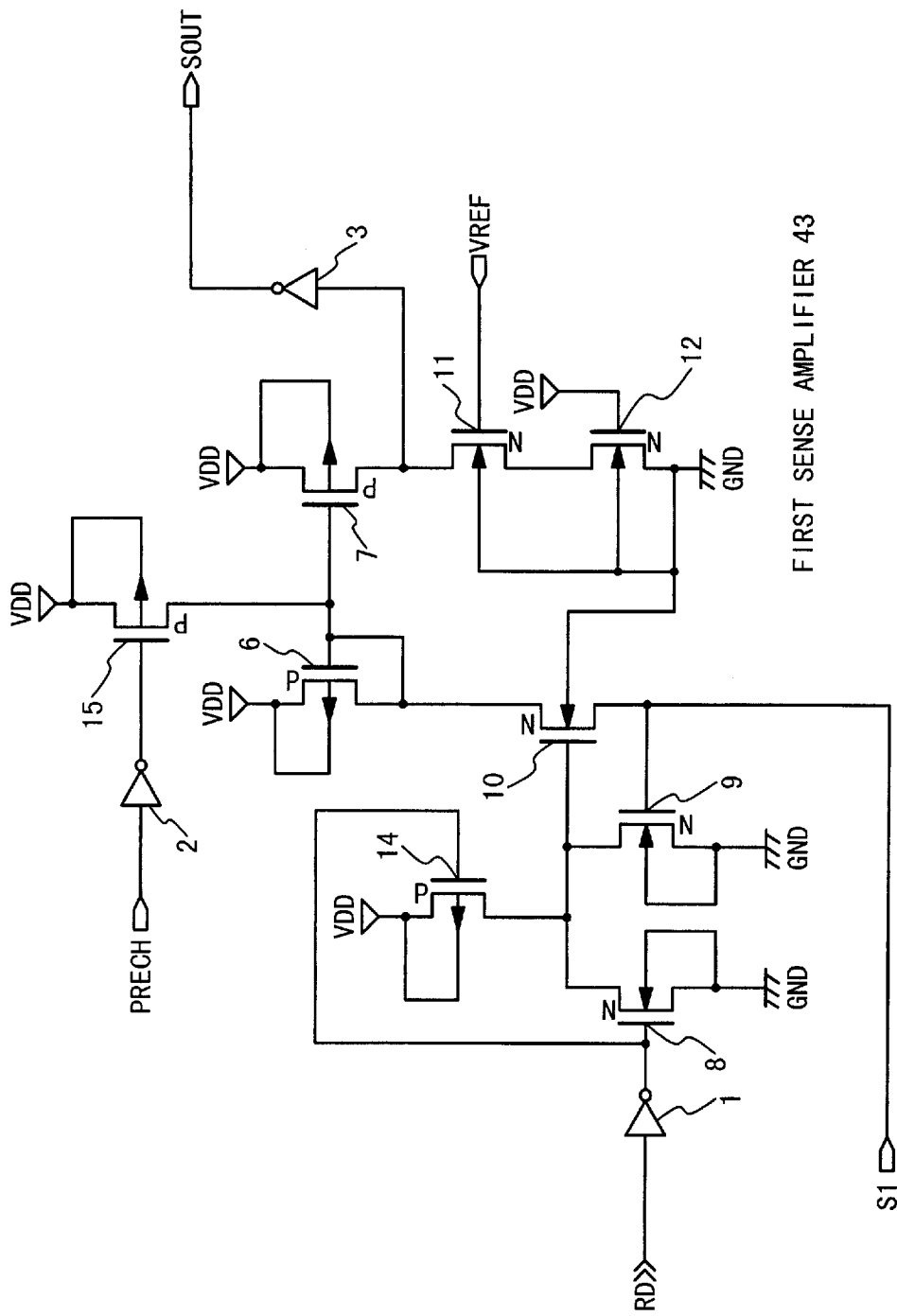
FIG. 5 is a circuit diagram showing a circuit configuration of a first sense amplifier in the embodiment shown in FIG. 3.

FIG. 5 is a view showing the circuit configuration of the first sense amplifier 43 shown in FIG. 3.

An inverter 1 receives the read signal RD, and outputs its inversion signal. A P-channel transistor P 14 receives from a gate thereof the output of the inverter 1, and the VDD power supply is supplied to a source thereof. An N-channel transistor N8 receives from a gate thereof the output of the inverter 1, the GND power supply is supplied to a source thereof, and a drain thereof is connected to a drain of the transistor P14. An inverter 2 receives the pre-charge signal PRECH, and outputs its inversion signal. The VDD power supply is supplied to a source of a P-channel transistor P15, and the output of the inverter 2 is sent to a gate thereof. A gate of a P-channel transistor P 6 is connected to a drain of the transistor 15, the VDD power supply is supplied to the source thereof, and the drain thereof is connected to the gate thereof. A gate of an N-channel transistor N 10 is connected to the drain of the transistor 14, and it is connected between a drain of a transistor 6 and a node S1. A gate of a transistor 9 is connected to the node S1, and the VDD power supply is supplied to a source thereof, and a drain thereof is connected to the drain of the transistor 14. A gate of a P-channel transistor P 7 is connected to the drain of the transistor 15, and a source thereof is connected to the VDD power supply. A reference voltage is supplied to a gate of an N-channel transistor N11, and a drain thereof is connected to the drain of the transistor 7. The VDD power supply is supplied to a gate of a transistor 12, the GND power supply is supplied to a source thereof, and a drain thereof is connected to the source of the transistor 11. An input of an inverter 3 is connected to the drain of the transistor 7, and it outputs an output signal Sout indicative of a sensed result. Biases of the respective transistors are as illustrated in the drawings.

This first sense amplifier 43 is the circuit for carrying out the pre-charge operation when the pre-charge signal PRECH is at the high level in the condition that the read signal RD is at the high level, and carrying out the sense operation when the pre-charge signal PRECH is at the low level. Their operations will be described below in detail. By the way, both the pre-charge operation and the sense operation are the reading operation. Thus, the read signal RD is kept at the high level in the periods of both the operations. Hence, the transistor 14 in the pre-charge operation and the sense operation is always at the on-state, and the transistor 8 is always at the off-state.

In order to carry out the pre-charge operation, the pre-charge signal PRECH is switched to the high level. Since this causes the low level to be supplied to the gate of the transistor 15, the transistor 15 is turned on, and the VDD potential is supplied to the drain of the transistor 10. At this time, the gate potential of the transistor 10 is determined by a ratio between the transistor 14 and the transistor 9. Thus, the gate width W/gate length L of each transistor is set such that the gate potential is equal to (1 V+VTN) (VTN is a threshold of an N-channel transistor). Hence, the transistor 10 outputs a potential of 1 V to the node S1.

Next, in order to carry out the sense operation, the pre-charge signal PRECH is switched to the low level. Since the high level is supplied to the gate of the transistor 15, the transistor 15 is turned off. So, a current mirror circuit is constituted by the transistors 6, 7. The gate potentials of the transistors 6, 7 are changed depending on whether or not a current flows through a selected memory cell. Moreover, the transistor 7 is set such that a current flows through the transistor 7, for example, by an amount equal to four times that of the transistor 6. For this reason, if a current flows through the selected memory cell, the gate potential of the transistor 7 is dropped so that the current equal to four times that of the transistor 6 flows through the transistor 7. Thus, an input potential of an inverter 3 is raised, and the output Sout becomes at the low level, namely, the data "1" is outputted. The transistors 11, 12 function as the current source. The reference voltage is set to a voltage so that when a current flows through the selected memory cell, the output Sout becomes at the low level. On the other hand, if the current does not. flow through the selected memory cell, an amount of a current flowing through the transistor 11 is greater than the amount of the current flowing through the transistor 7. Thus, the input potential of the inverter 3 is dropped. Hence, the output Sout becomes at the high level, namely, the data "0" is outputted.

Figure 6:
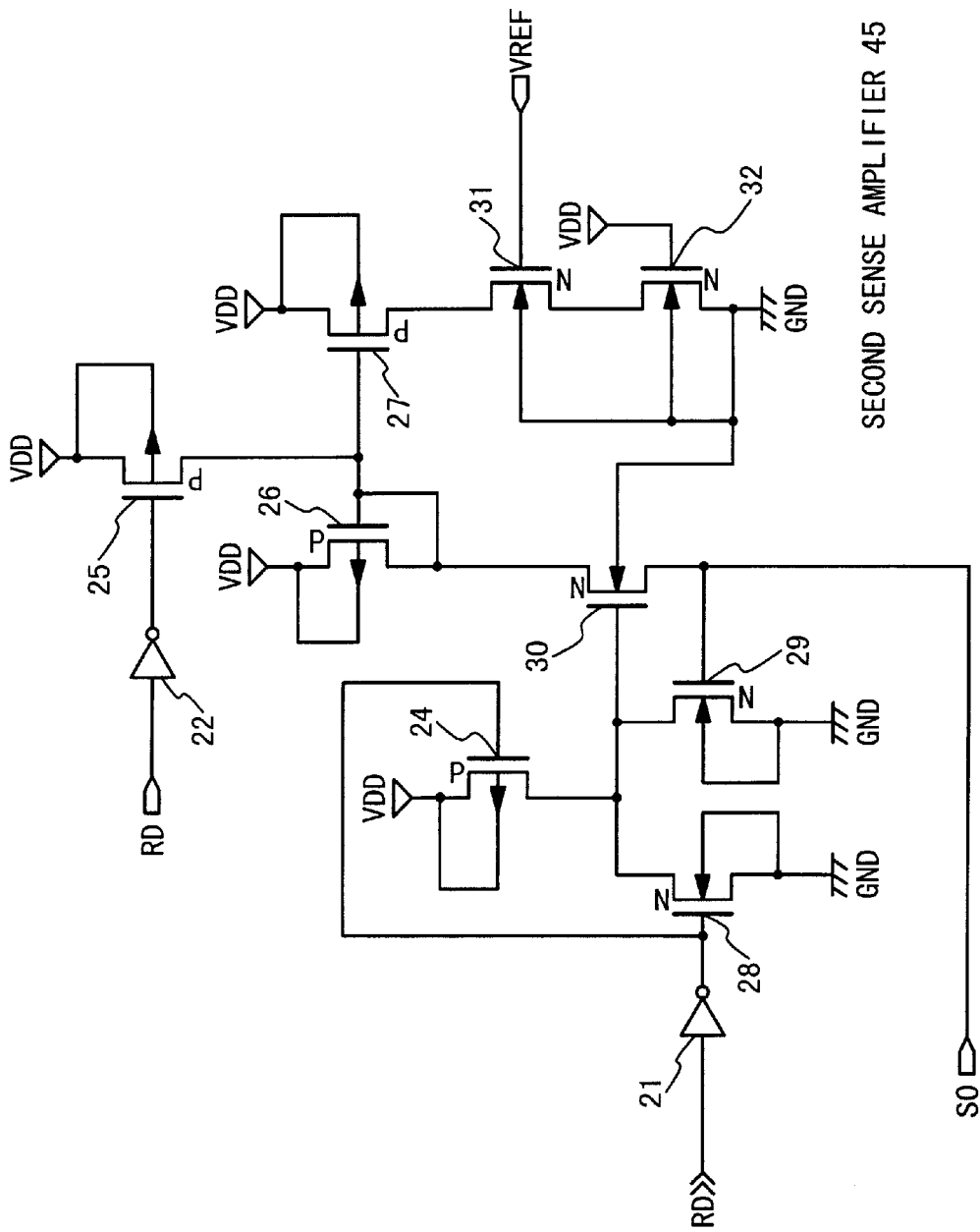
FIG. 6 is a circuit diagram showing a circuit configuration of a second sense amplifier in the embodiment shown in FIG. 3.

FIG. 6 is a view showing the circuit configuration of the second sense amplifier 45 shown in FIG. 3. In the second sense amplifier 45, input portions of inverters 21, 22 receive the read signal RD, as compared with the first sense amplifier 43 in FIG. 1. A drain of a transistor 30 is connected to a transistor P24, namely, a node SO. So, an inverter 3 is not mounted. The configuration besides the above-mentioned structure is equal to that of the first sense amplifier 43 in FIG. 5. Thus, the explanation thereof is omitted.

The second sense amplifier 45, since the read signal RD at the high level is sent at the time of the reading operation, supplies 1 V to the node SO similarly to the first sense amplifier 43 in FIG. 5. The second sense amplifier 45, since the read signal RD at the low level is sent except the case of the reading operation, does not supply 1 V to the node SO. By the way, the second sense amplifier 45 does not require the sense operation. Thus, the transistors 27, 31 and 32 may be omitted.

Figure 7:
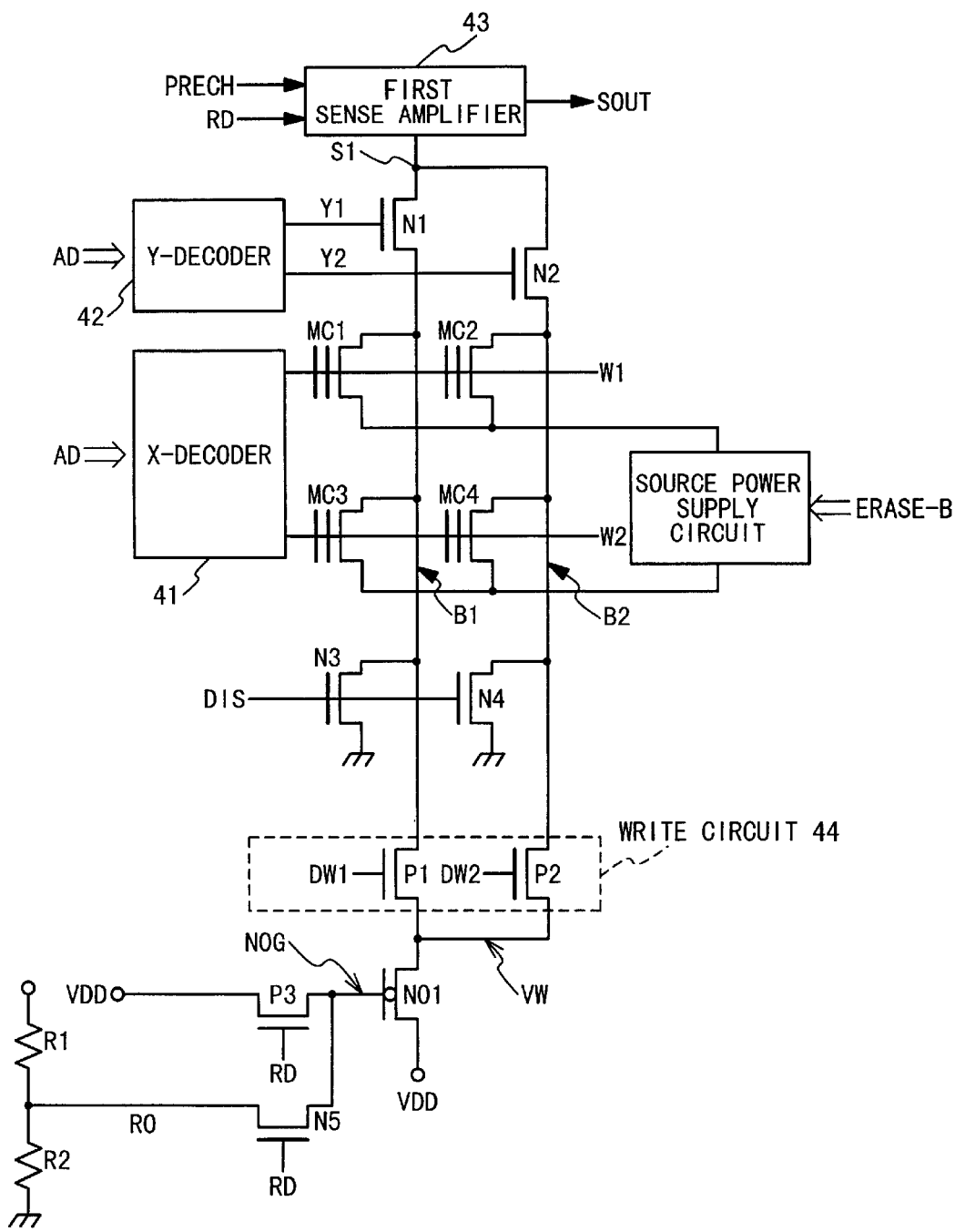
FIG. 7 is a circuit diagram showing a second embodiment of the present invention.

FIG. 7 is a view showing a second embodiment of the semiconductor memory apparatus according to the present invention. In FIG. 7, the same symbols are given to the portions similar to those of the first embodiment in the present invention shown in FIG. 3.

This embodiment is provided with: a resistor R1 connected to a VDD power supply and a contact RO; a resistor R2 connected to the contact RO and a GND power supply; a P-channel transistor P3 that is connected to the VDD power supply and a contact N0G and receives from a gate thereof an input signal RD; and an N-channel transistor N5 that is connected to the contact N0G and the contact RO and receives from a gate thereof the input signal RD. The other configurations are equal to those of the apparatus of FIG. 3. So, the explanation thereof is omitted.

The operation in this embodiment will be described below.

In this embodiment, at the time of the reading operation, the input signal RD is set to the high level. Thus, a voltage at the contact RO is supplied through the N-channel transistor N5 to the contact N0G.

Here, the potential VRO of the contact RO is defined as:

$$VRO = VDD \times R2/(R1+R2).$$

So, the resistance values of the resistors R1, R2 are determined such that the VRO is equal to or less than 1 V implying the potentials of the bit lines B1, B2 at the time of the reading operation.

Thus, a voltage of the power supply VW of the write circuit 44 at the time of the reading operation is VRO. So, even if the leakage current exists in the P-channel transistor P1 or P2 of the write circuit 44, the voltage of the bit line B1 or B2 is equal to or less than 1 V implying the expectation value when the reading operation is done. Thus, the bit line can be discharged in the original discharge period.

Figure 8:
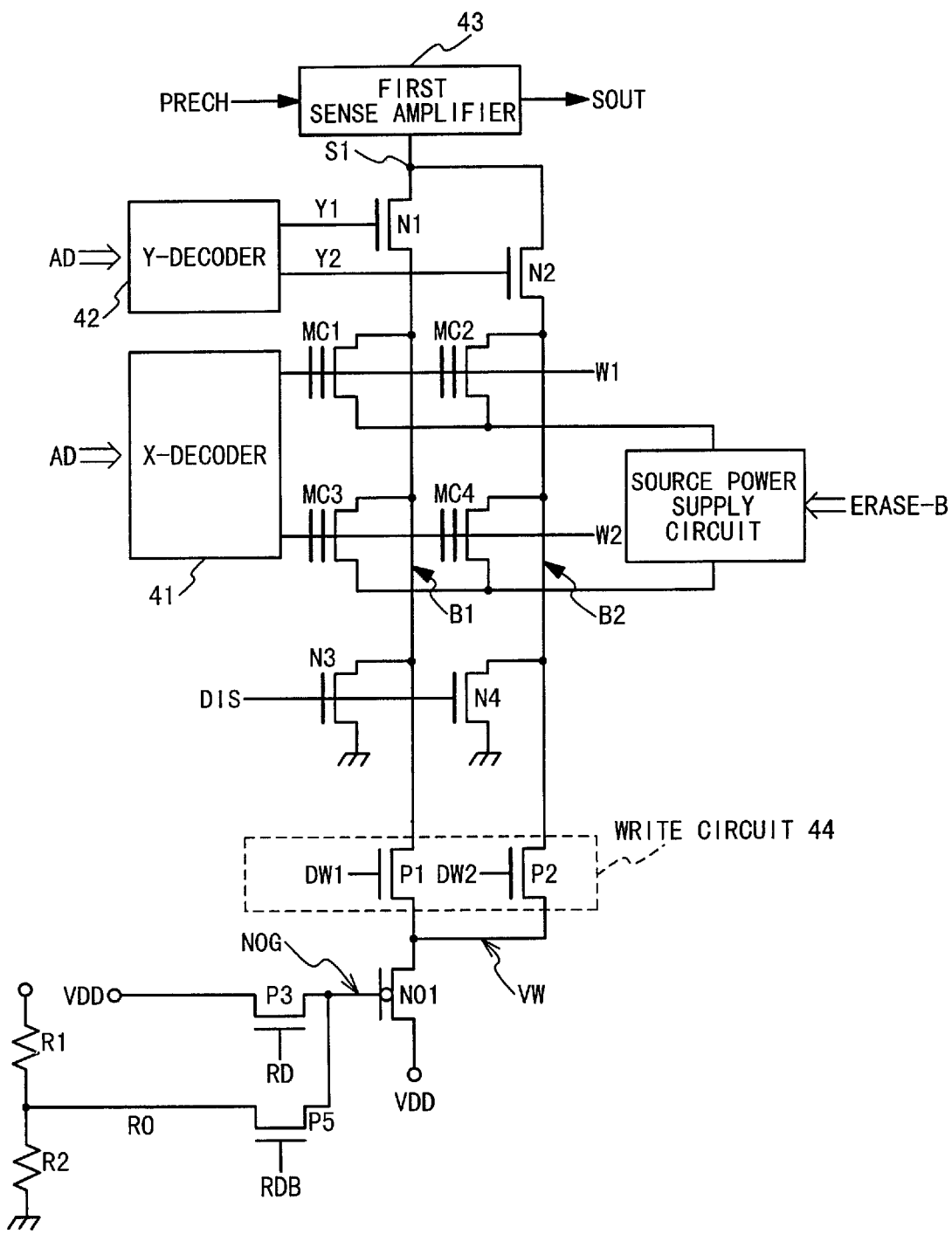
FIG. 8 is a circuit diagram showing a third embodiment of the present invention.

FIG. 8 is a view showing a third embodiment of the semiconductor memory apparatus according to the present invention. In FIG. 8, the same symbols are given to the portions similar to those of the first embodiment in the present invention shown in FIG. 3.

This embodiment is provided with: a resistor R1 connected to a VDD power supply and a contact RO; a resistor R2 connected to the contact RO and a GND power supply; a P-channel transistor P3 that is connected to the VDD power supply and a contact N0G and receives from a gate thereof an input signal RD; and a P-channel transistor P5 that is connected to the contact N0G and the contact RO and receives from a gate thereof the inversion read signal RDB. The other configurations are equal to those of the apparatus of FIG. 3. So, the explanation thereof is omitted.

In this embodiment, at the time of the reading operation, the input signal RD is set to the high level. Thus, a voltage at the contact RO is supplied through the P-channel transistor P5 to the contact N0G.

Here, the potential VRO of the contact RO is defined as:

$$VRO = VDD \times R2/(R1+R2).$$

So, the resistance values of the resistors R1, R2 are determined such that the VRO is equal to or less than 1 V implying the potentials of the bit lines B1, B2 at the time of the reading operation.

Thus, a voltage of the power supply VW of the write circuit 44 at the time of the reading operation is VRO. So, even if the leakage current exists in the P-channel transistor P1 or P2 of the write circuit 44, the voltage of the bit line B1 or B2 is equal to or less than 1 V implying the expectation value when the reading operation is done. Thus, the bit line can be discharged in the original discharge period.

By the way, the present invention is not limited to the above-mentioned embodiments. Various modifications may be made thereto, without departing from the spirit and scope of the present invention.

As mentioned above, at the time of the reading operation, the power supply of the write circuit 44 connected to the bit line is set to be equal to or less than the potential of the bit line selected at the time of the reading operation. Accordingly, even if the leakage current flows from the write circuit 44, the bit line can be prevented from being excessively charged. Thus, the discharge period of the bit line can be reduced to a minimum. Hence, the reading operation can be made faster without any increase in the discharge period.

What is claimed is:

1. A semiconductor memory apparatus, comprising:

a plurality of memory cells; and a write circuit performing a writing operation on at least one of said plurality of memory cells, and wherein a first voltage is supplied to said write circuit when said writing operation is performed on at least one of said plurality of memory cells, and wherein a second voltage equal to or lower than said first voltage is supplied to said write circuit when a reading operation is performed on at least one of said plurality of memory cells.

2. A semiconductor memory apparatus, comprising:

a plurality of memory cells connected to a plurality of bit lines; and a write circuit performing a writing operation on at least one of said plurality of memory cells, and wherein a specific voltage is supplied to said write circuit when a reading operation is performed on at least one of said plurality of memory cells, said specific voltage being equal to or lower than a voltage of at least one of said plurality of bit lines selected when said reading operation is performed.

3. A semiconductor memory apparatus, comprising:

a plurality of memory cells;

a plurality of bit lines connected to said plurality of memory cells;

a write circuit connected to said plurality of bit lines; and an N-channel transistor for connecting a first power supply to said write circuit when a first operation is performed and for connecting a second power supply different from said first power supply to said write circuit when a second operation different from said first operation is performed.

4. The semiconductor memory apparatus according to claim 3, wherein a first electrode of said N-channel transistor is connected to said write circuit, and a second electrode of said N-channel transistor is connected to a specific power supply, and one of a first voltage corresponding to said first power supply and a second voltage corresponding to said second power supply is supplied to a control electrode of said N-channel transistor.

5. The semiconductor memory apparatus according to claim 4, wherein said N-channel transistor is an N-channel non-doped transistor.

6. The semiconductor memory apparatus according to claim 4, further comprising:

a first transistor connected to said first power supply and to said control electrode of said N-channel transistor; and a second transistor connected to said second power supply and to said control electrode of said N-channel transistor.

7. The semiconductor memory apparatus according to claim 6, wherein said first and second transistors are a same conductive type with each other, and wherein a read signal outputted when a reading operation is performed on said memory cell is supplied to a control electrode of said first transistor, and wherein a reverse signal of said read signal is supplied to a control electrode of said second transistor.

8. The semiconductor memory apparatus according to claim 6, wherein a conductive type of said first transistor is opposite to a conductive type of said second transistor, and wherein a read signal outputted when a reading operation is performed on said memory cell is supplied to control electrodes of said first and second transistors.

9. The semiconductor memory apparatus according to claim 4, wherein said write circuit includes a P channel transistor provided between said N-channel transistor and said bit line.

10. The semiconductor memory apparatus according to claim 6, further comprising:

a first resistor connected between said first power supply and said second transistor; and a second resistor connected between a ground and said second transistor.

11. The semiconductor memory apparatus according to claim 3, wherein said memory cell is a non-volatile memory cell having a floating gate.

12. The semiconductor memory apparatus according to claim 3, wherein a second specific voltage corresponding to said second power supply is equal to or lower than a first specific voltage corresponding to said first power supply.

13. The semiconductor memory apparatus according to claim 3, wherein said second operation is a reading operation performed on said memory cell, and said first operation is any one of operations other than said reading operation.

14. The semiconductor memory apparatus according to claim 13, wherein said first operation is a writing operation performed on said memory cell.

15. The semiconductor memory apparatus according to claim 12, wherein said first specific voltage is a voltage of said bit line selected when a reading operation is performed on said memory cell.

16. The semiconductor memory apparatus according to claim 2, wherein said specific voltage is supplied to said write circuit such that at least one of said plurality of bit lines is not charged beyond said specific voltage even if at least one of said plurality of bit lines is charged by a leakage current outputted from said write circuit.

17. The semiconductor memory apparatus according to claim 7, wherein said second power supply includes a third transistor of a conductive type opposite to said conductive type of said first and second transistors connected to said second transistor, and a first unit supplying a third power supply voltage to said third transistor in response to said read signal, and a second unit supplying a voltage higher by a threshold voltage of said third transistor than said second power supply in voltage to a control electrode of said third transistor in response to said read signal.

18. The semiconductor memory apparatus according to claim 8, wherein said second power supply includes a same conductive type of third transistor with said second transistor connected to said second transistor, and a first unit supplying a third power supply voltage to said third transistor in response to said read signal, and a second unit supplying a voltage higher by a threshold voltage of said third transistor than said second power supply in voltage to a control electrode of said third transistor in response to said read signal.

19. The semiconductor memory apparatus according to claim 3, further comprising:

a sense amplifier connected to said plurality of bit lines supplying a read voltage to said plurality of bit lines in case of a first mode and detecting a change of a voltage of said bit line based on whether said memory cell is in a conducting state or a not-conducting state in case of a second mode.

20. The semiconductor memory apparatus according to claim 19, wherein said sense amplifier includes a current mirror circuit sensing a voltage level of said bit line, a third unit outputting said read voltage to said bit line, and a fourth unit activating said current mirror circuit and deactivating said third unit when a pre-charge signal is a first level and deactivating said current mirror circuit and activating said third unit when said pre-charge signal is a second level different from said first level.

* * * * *